(12) United States Patent
Tan

(10) Patent No.: US 6,967,532 B2
(45) Date of Patent: Nov. 22, 2005

(54) OFFSET-COMPENSATED SELF-BIASED DIFFERENTIAL AMPLIFIER

(75) Inventor: Tat Hin Tan, Penang (MY)

(73) Assignee: Intel Corporation, Santa Clara, CA (US)

(*) Notice: Subject to any disclaimer, the term of this patent is extended or adjusted under 35 U.S.C. 154(b) by 79 days.

(21) Appl. No.: 10/751,003

(22) Filed: Dec. 30, 2003

(65) Prior Publication Data

US 2005/0140442 A1      Jun. 30, 2005

(51) Int. Cl.[7] ................................................. H03F 3/45
(52) U.S. Cl. ........................... 330/253; 330/9; 330/258
(58) Field of Search ................................ 330/253, 258, 330/9

(56) References Cited

U.S. PATENT DOCUMENTS

| | | | | |
|---|---|---|---|---|
| 4,543,538 A | * | 9/1985 | Fay | 330/260 |
| 4,598,215 A | * | 7/1986 | Schechtman et al. | 327/66 |
| 4,937,476 A | | 6/1990 | Bazes | 307/475 |
| 5,684,414 A | * | 11/1997 | Linebarger et al. | 326/75 |
| 6,400,220 B1 | * | 6/2002 | Wang et al. | 330/9 |

* cited by examiner

Primary Examiner—Patricia Nguyen
(74) Attorney, Agent, or Firm—Schwegman, Lundberg, Woessner & Kluth, P.A.

(57) ABSTRACT

An apparatus comprising a differential amplifier having a first input coupled to receive a voltage reference signal, a second input and an output. The apparatus also includes an inverter whose input is coupled to the differential amplifier output. The inverter includes first and second transistors that have source/drain regions. A third transistor is coupled between a source/drain region of the inverter and a power supply rail to cause a switching point of the inverter to track a common mode bias voltage of the differential amplifier.

27 Claims, 8 Drawing Sheets

OFFSET-COMPENSATED SELF-BIASED DIFFERENTIAL AMPLIFIER

BACKGROUND

Interface circuits are used to transmit and receive electrical signals between devices in electronic systems. These systems include digital systems where the signals communicated between the devices transition between high and low voltage levels. In some of these systems electrical signals need to be transmitted between integrated circuits (ICs). Interface circuits are used to minimize the effects of electrical interference, such as noise, that interferes with signal transitions between logic levels. They are also helpful to compensate for weak signal line drivers.

Interface circuits designed to sense the signal transitions on input signal lines provide improved signal communication. As an input signal approaches a midpoint between the high and low voltage levels, an interface circuit senses the transition and provides "clean" signal transitions to the circuits internal to the ICs by driving the inputs of the internal circuits to either the high or low level. Typically these interface circuits consist of amplifiers that sense the voltage transitions. A sense amplifier compares an input signal to a voltage reference. The comparison is done using a differential pair at the input of the amplifier. The output of the amplifier transitions when the input signal equals the voltage reference.

A general trend in IC design is to reduce system power consumption in part by reducing the power supply voltages. Variations in the difference between the high supply voltage and the transition voltage can occur among wafer runs due to variations in the fabrication process. If the variations result in an offset that causes the transition voltage to move towards the higher voltage supply rail and the cause the higher voltage supply rail to move towards the transition voltage, the system becomes more susceptible to spurious transitions from noise. This is especially important when supply voltages are below the two-volt level.

Some designers have approached the problem by tuning the amplifier stages to a specific transition voltage and supply voltage. However, if a different supply voltage is desired, the circuits need to be redesigned to accommodate the new voltage reference and transition voltage levels. What is needed is an interface circuit design with a transition voltage that accommodates changes in the supply voltage.

BRIEF DESCRIPTION OF THE DRAWINGS

In the drawings like numerals refer to like components throughout the several views.

DETAILED DESCRIPTION

In the following detailed description, reference is made to the accompanying drawings which form a part hereof, and in which is shown by way of illustration specific embodiments in which the invention may be practiced. It is to be understood that other embodiments may be used and structural changes may be made without departing from the scope of the present invention.

Figure 1A:
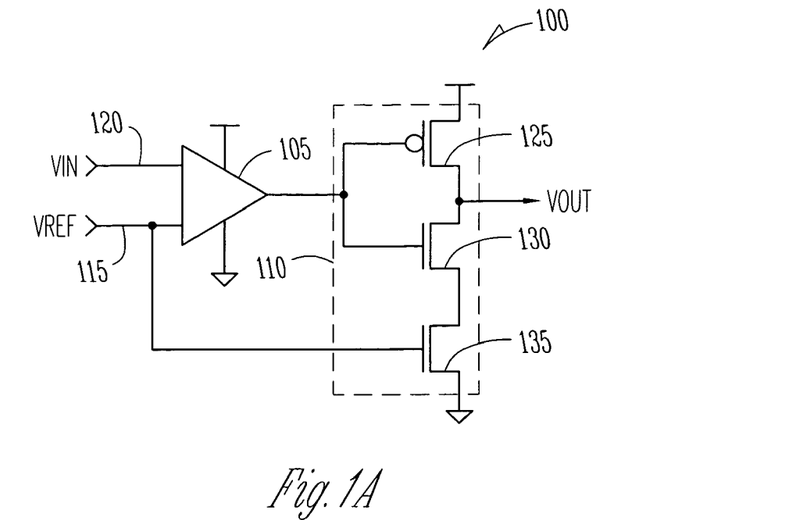
FIG. 1A is a drawing of an embodiment of a reference voltage modulated NMOS differential amplifier.

This document describes an amplifier that uses reference-voltage modulation to compensate for amplifier offsets. FIG. 1A is a drawing of an embodiment of a reference voltage modulated NMOS differential amplifier 100. The amplifier includes a first stage 105 and a second stage 110. The output of the first stage 105 is a differential amplifier to sense the signal transitions and the second stage 110 is an output gain stage that includes an inverter. The first stage 105 transitions when the input voltage 120 approaches the reference voltage 115. Setting the input voltage 120 equal to the reference voltage 115 causes the output of the differential amplifier 105 to be equal to the common mode bias voltage of the amplifier 105. Thus, when the input voltage signal 120 transitions past the voltage reference 115, the output of the amplifier 105 switches through the common mode bias voltage.

The inverter also has a transition voltage referred to as a switching point. Normally, the switching point voltage and the common mode bias voltage are independent of each other with the common mode bias tuned to a particular voltage reference used with a particular supply voltage. Process variations can cause offsets in the common mode bias voltage of the differential amplifier stage and the switching point of the gain stage to be additive offsets. Ideally, the switching point of the inverter matches the common mode bias voltage which in turn matches the voltage reference 115.

Setting the voltage reference 115 equal to a point midway between the higher and lower voltage power supply rails results in the most symmetric voltage swing between the high and low logic levels. Having a symmetric voltage swing leads to symmetric noise margins with respect to the higher and lower supply rails which produces a more robust system. Offsets in the voltage reference 115 result in non-symmetric signal swings that reduce the noise margin. Which noise margin is reduced, either the margin in the high or the low direction, depends on the direction of the offset. These offsets vary due to variations of the IC fabrication process. As the voltage signal swings become smaller as the voltages of power supply rails are reduced, these offsets make the circuits more likely to have spurious transitions due to noise.

The amplifier 100 of the present application is reference voltage modulated in the sense that the common mode bias and the switching point of the gain stage inverter are made to be dependent on the reference voltage 115. This results in the common mode bias and the switching point of the gain stage tracking any changes in the reference voltage 115. Thus, the amplifier 100 does not necessarily need to be redesigned if the supply voltage and the reference voltage 115 are changed.

The voltage reference signal ($V_{REF}$) 115 is coupled to one input of the differential amplifier 105 and the other input is coupled to the input signal ($V_{IN}$) 120. The gain stage 110 of the amplifier 100 includes an inverter consisting of PMOS and NMOS transistors 125, 130 modified by a stacked pull-down NMOS transistor 135. The gate region of the stacked NMOS transistor 135 is coupled to the voltage reference 115.

Figure 1B:
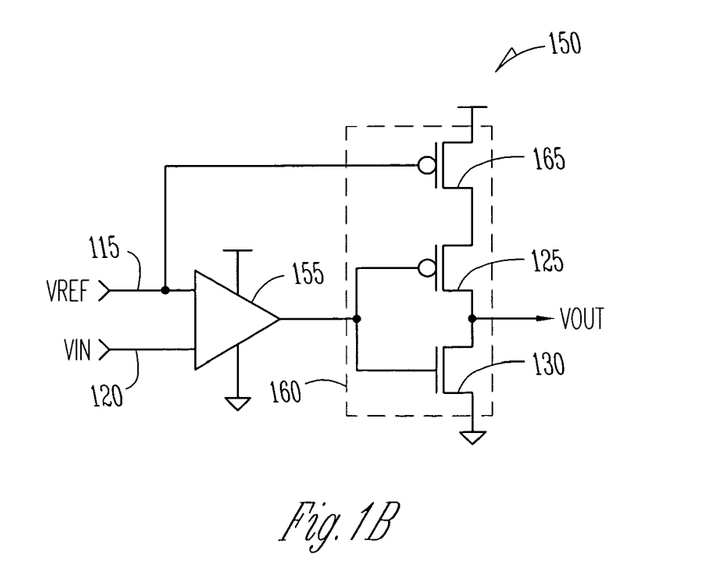
FIG. 1B is a drawing of an embodiment of a reference voltage modulated PMOS differential amplifier.

FIG. 1B is a drawing of a PMOS embodiment of a differential amplifier 150. In this embodiment, a gain stage 160 of the amplifier 150 includes an inverter consisting of PMOS and NMOS transistors 125, 130 modified by a stacked pull-up PMOS transistor 165. The gate region of the stacked PMOS transistor 165 is coupled to the voltage reference 115.

Adding the stacked transistor 135, 165 to the inverter gain stage 110, 160 and driving the gate regions of the stacked transistors 135, 165 with the voltage reference 115 provides tracking between the voltage reference 115 and the switching point of the inverter gain stage 110, 160 as described below.

Figure 2A:
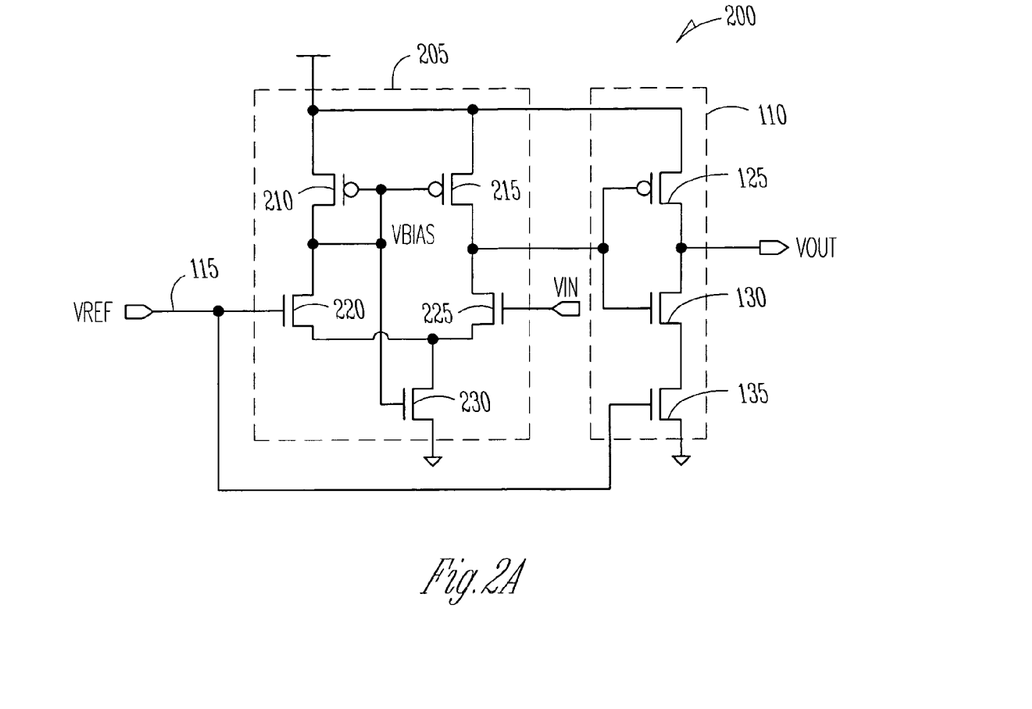
FIG. 2A is a drawing of an embodiment of a reference voltage modulated NMOS self-biased differential amplifier.

FIG. 2A is a drawing of an embodiment of a reference-voltage modulated NMOS self-biased differential amplifier 200. This amplifier 200 uses a self-biased differential amplifier 205 in the first stage. The self-biased amplifier 205 includes a PMOS current mirror load 210, 215 on the input NMOS transistor differential pair 220, 225. It also includes NMOS tail transistor 230. The self-biased amplifier 205 is self-biased in that the tail transistor 230 that normally biases the current shared between the input differential pair transistors 220, 225 is biased by the gate voltage of the current mirror loads 210, 215. The bias voltage will then track variances in fabrication processes. This self-biased amplifier 205 is sometimes referred to as a Chappel amplifier. In an embodiment, the gain stage of the amplifier 200 is the stacked inverter 110 with the gate of the stacked transistor 135 connected to the reference voltage 115. The tail transistor 230 and the stacked transistor 135 operate in the linear region. The remaining NMOS transistors and the PMOS transistors operate in the saturated region.

Figure 2B:
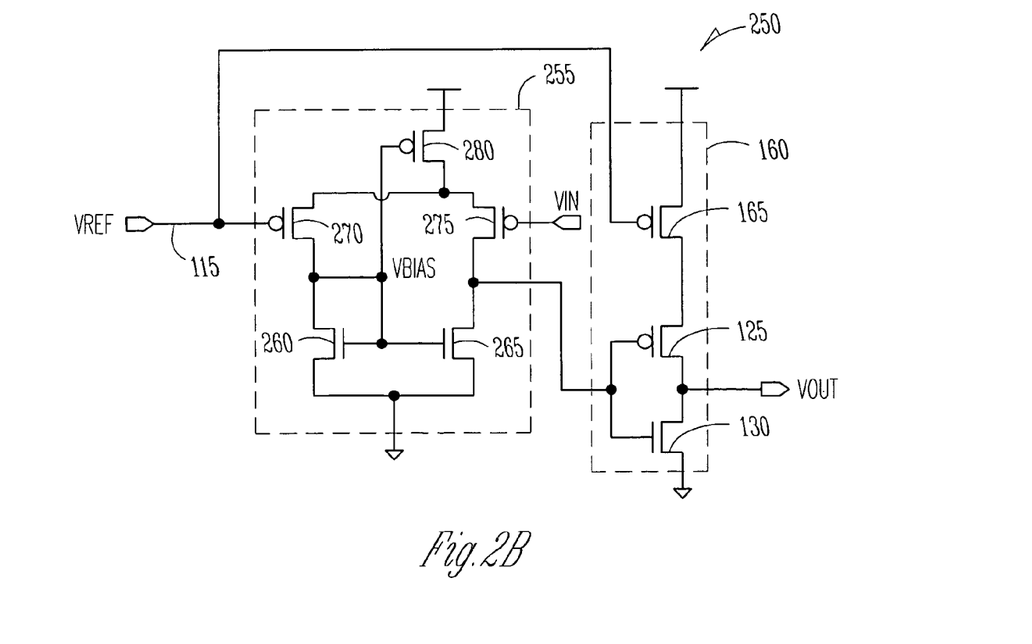
FIG. 2B is a drawing of an embodiment of a reference voltage modulated PMOS self-biased differential amplifier.

FIG. 2B is a drawing of an embodiment of a reference-voltage modulated PMOS self-biased differential amplifier 250. The self-biased amplifier 255 in this stage includes an NMOS current mirror load 260, 265 on the input PMOS transistor differential pair 270, 275. The amplifier also includes PMOS tail transistor 280. In an embodiment, the gain stage of the amplifier 250 is the stacked inverter 160.

The tracking between the voltage reference 115, the common mode bias and the switching point of the inverter gain stage 110, 160 will now be described with respect to the NMOS differential amplifier 200 shown in FIG. 2A. An equation for the common mode bias voltage ($V_{BIAS}$) as a function of the reference voltage $V_{REF}$ is obtained by applying Kirchoff's current law to the transistors of the self-biased differential amplifier 205 and using the equations for the drain current of transistors biased in the saturated and linear regions assuming the drain source voltage is very small for a transistor operating in the linear region. An equation for $V_{BIAS}$ as a function of $V_{REF}$, is obtained using the quadratic equation to solve the equations obtained from applying Kirchoff's Current Law, $$V_{BIAS} = \frac{1}{2a}\left(-b + \sqrt{b^2 - 4ac}\right)$$

where $$a = \frac{\beta_{ntail}}{\sqrt{\beta_{ngate}}}\sqrt{\beta_p} - 2\beta_p$$

$$b = \beta_{ntail}\sqrt{\frac{\beta_p}{\beta_{ngate}}}(V_{THP} - V_{DD} - V_{THN}) +$$

$$\beta_{ntail}(V_{REF} - V_{THN}) + 4\beta_p(V_{DD} - V_{THP})$$

$$c = \sqrt{\beta_p}\,V_{THN}\beta_{ntail}\frac{V_{DD} - V_{THP}}{\sqrt{\beta_{ngate}}} +$$

$$V_{THN}\beta_{ntail}(V_{THN} - V_{REF}) - 2\beta_p(V_{DD} - V_{THP})^2.$$

$V_{DD}$ is the higher supply voltage, $V_{THP}$ is the threshold voltage for PMOS transistors and $V_{THN}$ is the threshold voltage for NMOS transistors.

Turning now to the inverter gain stage 110, for minimal or almost zero offset the switching point of the inverter stage $V_{SP}$ should be equal to the common mode bias $V_{BIAS}$ of the self-biased differential amplifier 205.

Again using the quadratic formula to solve equations obtained from applying Kirchoff's Current Law for the drain currents of the transistors and assuming that the inverter transistors 125, 130 operate in the saturation region and the stacked transistor 135 operates in the linear region leads to $$V_{SP} = \frac{1}{2a_2}\left(-b_2 + \sqrt{b_2^2 - 4a_2c_2}\right)$$

where $$a_2 = \frac{-2}{\beta_{ntail2}}\beta_{p2}$$

$$b_2 = (V_{REF} - V_{THN})\left(\sqrt{\frac{\beta_{p2}}{\beta_{ngate2}}} + 1\right) +$$

$$4\frac{\beta_{p2}}{\beta_{ntail2}}(V_{DD} - V_{THP})$$

$$c_2 = (V_{REF} - V_{THN})\left(\sqrt{\frac{\beta_{p2}}{\beta_{ngate2}}}(V_{THP} - V_{DD}) - V_{THN}\right) -$$

$$2\frac{\beta_{p2}}{\beta_{ntail2}}(V_{THP} - V_{DD})^2.$$

Figure 3:
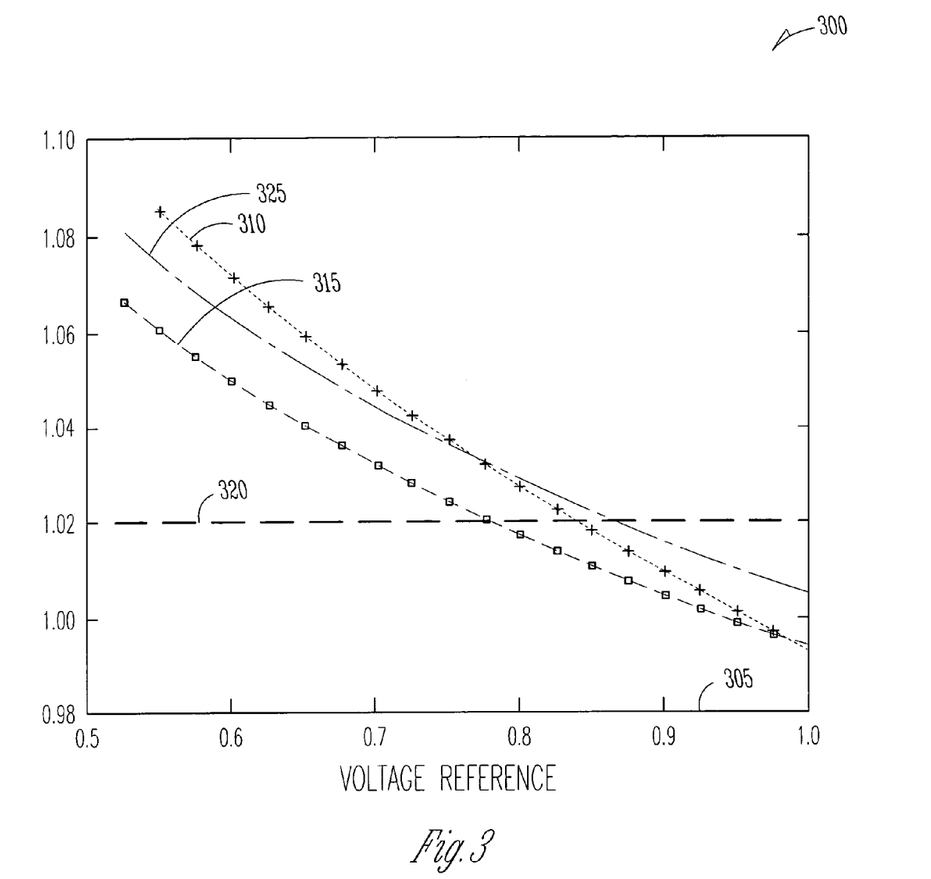
FIG. 3 is a graph showing the effect of tying the switching point of the inverter gain stage to the voltage reference.

Substituting values for $V_{THP}$, $V_{THN}$, $V_{DD}$ and $\beta$ values with typical values from the foundry results in the graph 300 shown in FIG. 3. In the graph 300, the voltage reference $V_{REF}$ 115 is shown varying from 0.5 volts to 1 volt along the x-axis 305. As the voltage reference 115 changes, curve 310 shows the variation the common mode bias $V_{BIAS}$ of the self-biased differential amplifier 205, 255. Curve 315 shows the variation of the switching point $V_{SP}$ of the inverter gain stage 110. It can be seen from the curves 310, 315 that the common mode bias $V_{BIAS}$ and the switching point $V_{SP}$ both track the change in voltage reference $V_{REF}$. In contrast, the switching point of a normal inverter gain stage is independent of $V_{REF}$ and $V_{BIAS}$ and provides no tracking with $V_{REF}$ as is shown by the straight line 320 in the graph 300.

In an embodiment of the present application, power supply rails that vary over a range including 1.05 volts to 1.8 volts and reference voltages 115 that vary over a range including 0.6 volts to one volt are accommodated. In another embodiment, the difference in voltage between the power supply rails is about 3 volts.

In a further embodiment, improved tracking of the switching point $V_{SP}$ with the common mode bias $V_{BIAS}$ is achieved by scaling the voltage reference 115 at the gate of the stacked transistor 135. Scaling refers to providing a voltage that is proportional to the voltage reference 115. Curve 325 shows the effect of providing a voltage of the gate of the stacked transistor that is equal to $0.9*(V_{REF})$. It can be seen from the curve 325 that the switching point $V_{SP}$ more closely tracks the common bias $V_{BIAS}$ curve 315.

Figure 4A:
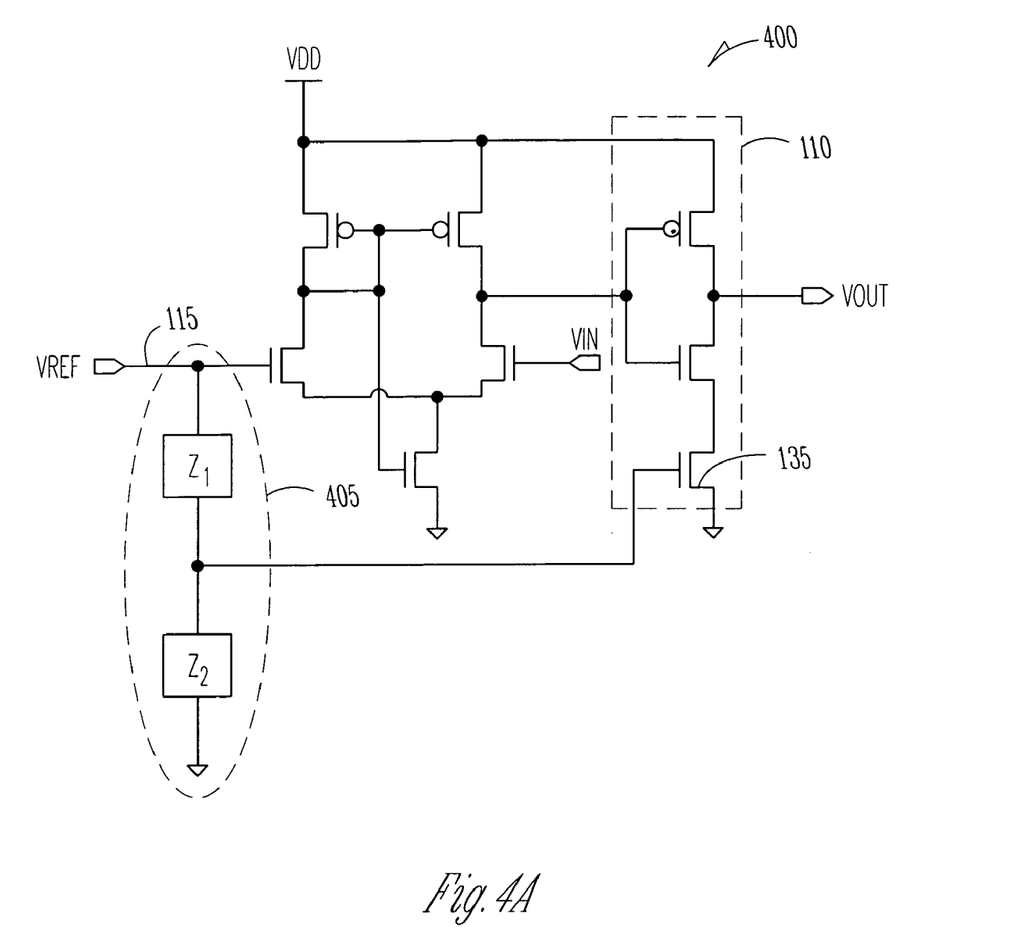
FIGS. 4A and 4B are drawings of embodiments of scaled reference voltage modulated versions of the amplifiers in 2A and 2B.
Figure 4B:
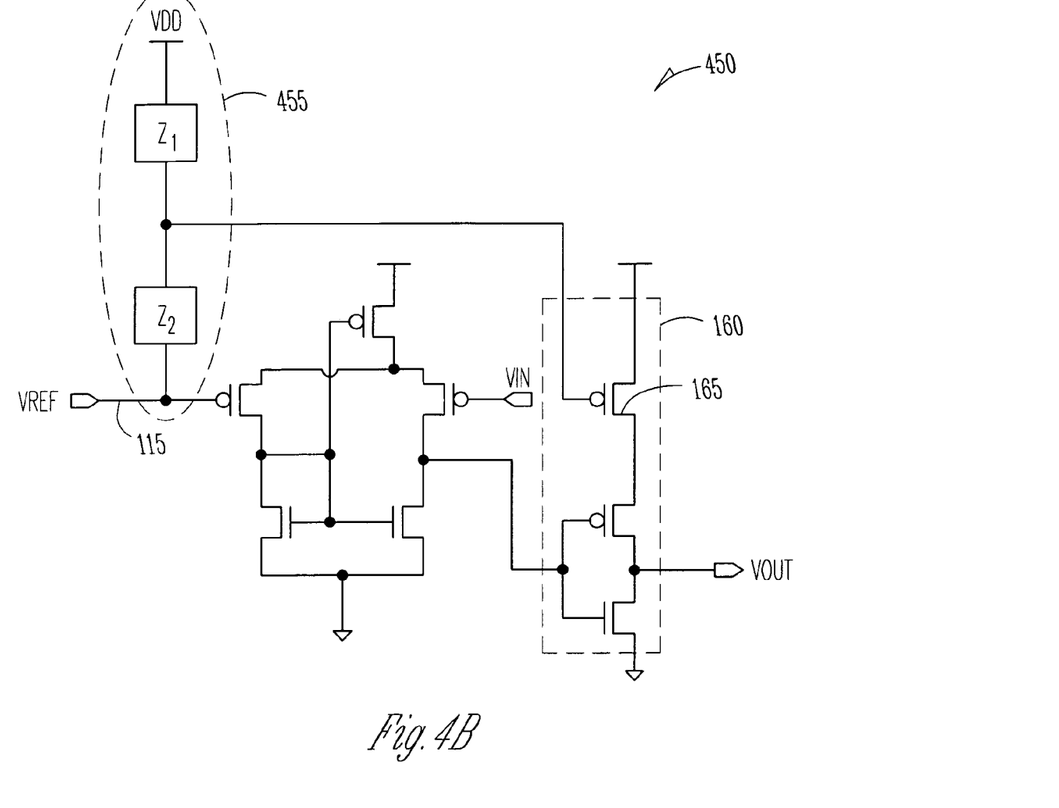

FIGS. 4A and 4B are drawings of embodiments of amplifiers 400, 450 that provide a voltage proportional to the voltage reference 115 (or a scaled reference voltage) to the gate regions of the stacked transistors 135, 165. The scaled voltage is provided by the impedance divider circuits 405, 455. The scaled voltage is equal to $$V_{REF} \frac{Z_2}{Z_1 + Z_2} \text{ in FIG. 4A, and}$$

$$\frac{V_{DD}Z_2 + V_{REF}Z_1}{Z_1 + Z_2} \text{ in FIG. 4B.}$$

In an embodiment, the impedance divider circuit 405, 455 is a resistive divider circuit. In another embodiment, the impedance divider circuit 405, 455 is a capacitive divider circuit. In another embodiment, the impedance divider circuit 405, 455 is implemented using components internal to the same integrated circuit that contains the amplifier. In another embodiment the impedance divider circuit 405, 455 is implemented external to the integrated circuit using precision components.

Figure 5:
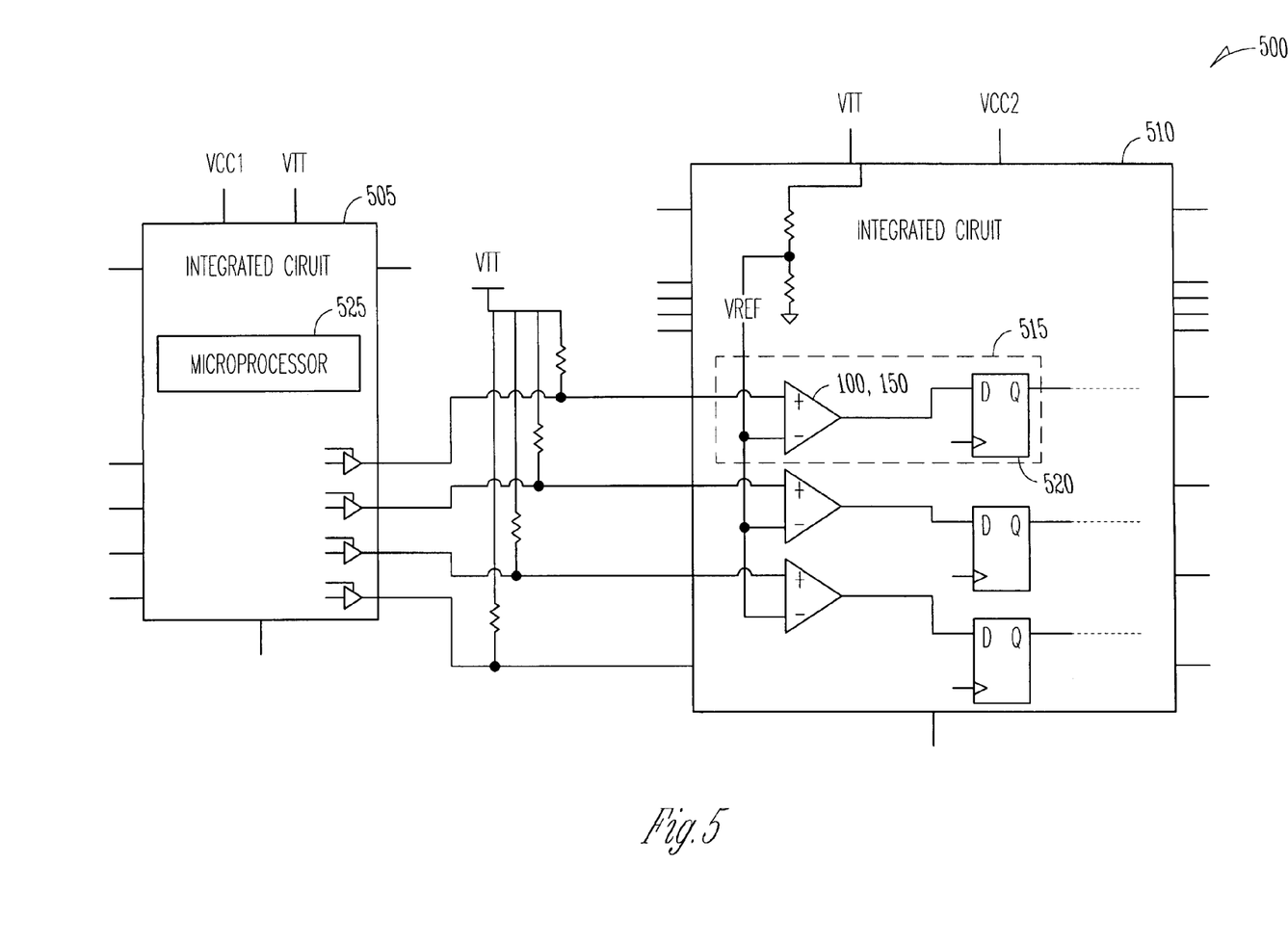
FIG. 5 is a block diagram of one embodiment of a system that includes two integrated circuits.

FIG. 5 is a block diagram representing an embodiment of a system that includes two integrated circuits (ICs) 505, 510. The second IC 510 includes a plurality of interface circuits 515 to receive electrical signals from the first IC 505. The interface circuits 515 include reference-voltage modulated NMOS differential amplifiers 100, 150. The received electrical signals are then input to flip-flop circuits 520 or latches. In one embodiment, the difference between a higher voltage supply rail (VTT) and the lower voltage supply rail (VCC) on the first IC 505 is equal to the difference between the higher voltage supply rail (VTT) and a lower voltage supply rail (VCC2) on the second IC 510. In another embodiment, the differences are unequal. For example, the difference on the first IC 505 is about 1.5 volts while the difference on the second IC 510 could be within a range including about 1.05 volts to about 1.8 volts. In yet another embodiment, the first and second ICs are included in a chipset for a memory controller. In a further embodiment, the first IC includes a microprocessor 525.

Figure 6:
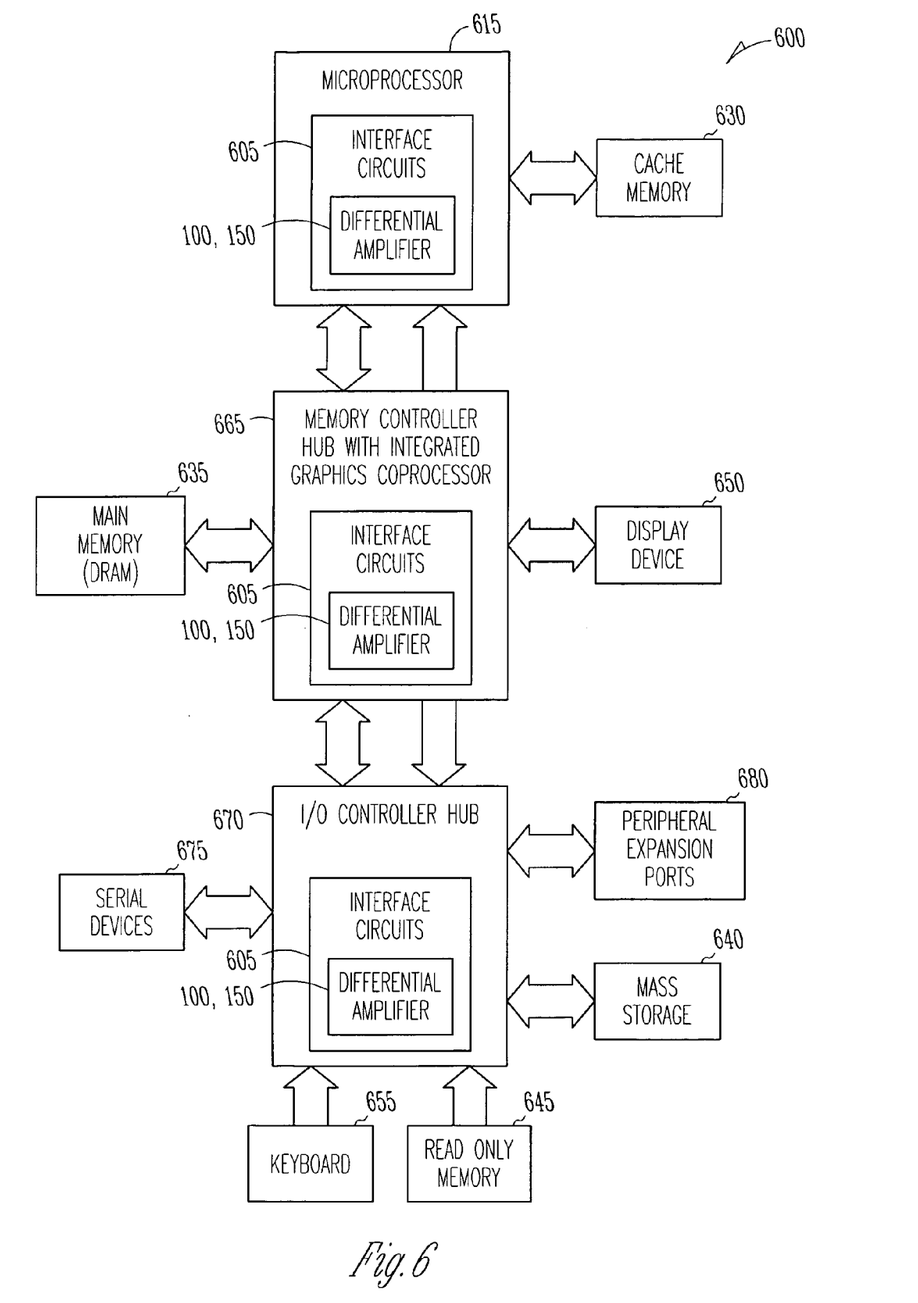
FIG. 6 is a block diagram of one embodiment of a computer system that uses interface circuits that include reference voltage modulated differential amplifiers.

FIG. 6 is a block diagram of one embodiment of a computer system 600 that uses interface circuits 605 that include reference voltage modulated differential amplifiers 100, 105. The computer system 600 includes a processor 615 for processing information. In one embodiment, the processor 615 communicates with a memory controller hub 665 through the interface circuits 605. A cache memory 630 is coupled to the processor 615 for storing information frequently used by the processor 615, and a main memory 635 is coupled to the processor 615 including random access memory (RAM) for storing information and instructions for the processor 615. In another embodiment, the microprocessor 615, the memory controller hub 665 and the main memory 635 are integrated into one IC. In another embodiment, the memory controller hub 665 includes an integrated graphics coprocessor. In one embodiment of the memory, the memory includes DRAM. In another embodiment, the memory includes SRAM. In yet another embodiment, the memory includes Flash memory.

The computer system 600 also includes an input/output (I/O) controller hub 670. The I/O controller hub 670 communicates with the memory controller hub 665 through interface circuits 605. Also included in the system 600 is a read only memory (ROM) 645 or other non-volatile storage device for storing fixed information for the processor 615. Other components such as a mass storage device 640, a display device 650, a keyboard 655 or other input device, serial devices 675 and peripheral expansion ports 680 may also be included in the computer system 600.

Figure 7:
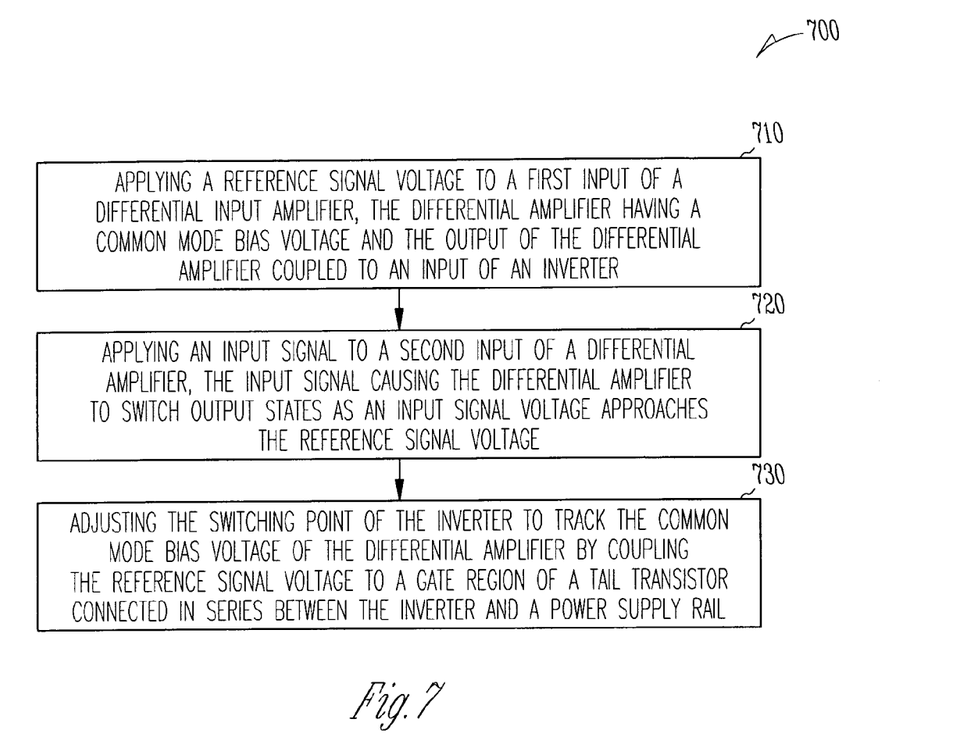
FIG. 7 is a block diagram of a method of compensating for the offset in a self-biased differential amplifier.

FIG. 7 is a block diagram of a method of compensating for the offset in a self-biased differential amplifier. At 710, a voltage reference signal is applied to a first input of a differential input amplifier, the differential amplifier having a common mode bias voltage and the output of the differential amplifier coupled to an input of an inverter. At 720, an input signal is applied to a second input of a differential amplifier, the input signal causing the differential amplifier to switch output states as an input signal voltage approaches a voltage reference signal voltage. At 730, the switching point of the inverter is adjusted to track the common mode bias voltage of the differential amplifier by coupling the voltage reference to a gate region of a tail transistor connected in series between the inverter and a power supply rail.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus comprising:
   a differential amplifier, the differential amplifier having a first input coupled to receive a voltage reference signal, a second input and an output;
   an inverter, the inverter input coupled to the differential amplifier output, wherein the inverter includes first and second transistors, the first and second transistors having source/drain regions; and
   a third transistor coupled between a source/drain region of the inverter and a power supply rail to cause a switching point of the inverter to track a common mode bias voltage of the differential amplifier.

2. The apparatus of claim 1, wherein the differential amplifier is a self-biased amplifier.

3. The apparatus of claim 1, wherein a first source/drain region of the third transistor is coupled to the source/drain region of the inverter and a second source/drain region of the third transistor is coupled to the power supply rail, and wherein a gate region of the third transistor is coupled to receive the voltage reference signal.

4. The apparatus of claim 3, wherein the gate region of the third transistor is coupled to a voltage scaling circuit to receive a voltage proportional to the voltage reference signal.

5. The apparatus of claim 4, wherein the scaling circuit is an impedance divider circuit.

6. The apparatus of claim 5, wherein the impedance divider circuit is a resistive divider circuit.

7. The apparatus of claim 5, wherein the impedance divider circuit is a capacitive divider circuit.

8. The apparatus of claim 2, wherein the differential amplifier includes:
   an NMOS transistor differential input pair, wherein gate regions of the differential input pair are coupled to the amplifier first and second inputs;
   a PMOS transistor current mirror pair coupled as loads to first source/drain regions of the differential input pair and coupled to a higher voltage supply rail; and
   an NMOS tail transistor, a first source/drain region of the tail transistor coupled to second source/drain regions of the differential input pair, a second source/drain region of the tail transistor coupled to a lower voltage supply rail and a gate region of the tail transistor coupled to gate regions of the current mirror pair.

9. The apparatus of claim 8, wherein the third transistor is an NMOS transistor and is coupled to the lower voltage supply rail.

10. The apparatus of claim 2, wherein the differential amplifier includes:
    a PMOS transistor differential input pair, wherein gate regions of the differential input pair are coupled to the amplifier first and second inputs;
    an NMOS transistor current mirror pair coupled as loads to first source/drain regions of the differential input pair and coupled to a lower voltage supply rail; and
    a PMOS tail transistor, a first source/drain region of the tail transistor coupled to second source/drain regions of the differential input pair, a second source/drain region of the tail transistor coupled to a higher voltage supply rail and a gate region of the tail transistor coupled to gate regions of the current mirror pair.

11. The apparatus of claim 10, wherein the third transistor is a PMOS transistor and is coupled to the higher voltage supply rail.

12. The apparatus of claim 1, wherein the apparatus is an input signal buffer circuit, and wherein an input signal is applied to the second input of a differential amplifier to cause the amplifier to switch output states as the input signal approaches the voltage reference signal.

13. The apparatus of claim 1, wherein the reference voltage is within a range including 0.6 volts to one volt.

14. The apparatus of claim 1, wherein the difference between a lower voltage supply rail and a higher voltage supply rail is within a range including 1.05 volts to 1.8 volts.

15. The apparatus of claim 1, wherein the difference between a lower voltage supply rail and a higher voltage supply rail is about three volts.

16. A method comprising:
    applying a reference signal voltage to a first input of a differential input amplifier, the differential amplifier having a common mode bias voltage and the output of the differential amplifier coupled to an input of an inverter;
    applying an input signal to a second input of the differential amplifier, the input signal causing the differential amplifier to switch output states as an input signal voltage approaches the reference signal voltage; and
    adjusting the switching point of the inverter to track the common mode bias voltage of the differential amplifier by coupling the reference signal voltage to a gate region of a tail transistor connected in series between the inverter and a power supply rail.

17. The method of claim 16, wherein coupling the reference signal voltage to a gate region of a tail transistor includes coupling a voltage proportional to the reference signal voltage to the gate region of the tail transistor.

18. The method of claim 17, wherein applying a reference signal voltage includes changing the reference signal voltage if a voltage difference between a higher voltage supply rail and a lower voltage supply rail changes.

19. The method of claim 18, wherein coupling a voltage proportional to the reference signal voltage includes changing the proportional voltage if the voltage difference between the higher and lower supply rails changes.

20. A system comprising:
    a first integrated circuit;
    a second integrated circuit, the second integrated circuit including a plurality of interface circuits coupled to the first integrated circuit, an interface circuit including:
      a differential amplifier, the differential amplifier having a first input coupled to receive a voltage reference signal, a second input and an output;
      an inverter, the inverter input coupled to the differential amplifier output, wherein the inverter includes first and second transistors, the first and second transistors having source/drain regions; and
      a third transistor coupled between the inverter and a power supply rail such that a first source/drain region of the third transistor is coupled to a source/drain region of the inverter and a second source/drain region of the third transistor is coupled to the power supply rail, and wherein a gate region of the third transistor is coupled to receive the voltage reference signal.

21. The system of claim 20, wherein the voltage reference is scalable to adjust the reference in response to a change in a high voltage power supply rail of the first integrated circuit.

22. The system of claim 21, wherein a difference between a higher voltage supply rail and a lower voltage supply rail on the first integrated circuit is unequal to a difference between a difference between a higher voltage supply rail and a lower voltage supply rail on the second integrated circuit.

23. The system of claim 20, wherein the first and second integrated circuits are included in a memory controller.

24. The system of claim 20, wherein the first integrated circuit includes a processor.

25. A computer system comprising:
 a DRAM;
 a memory controller coupled to the DRAM; and
 a processor coupled to the memory controller, the processor to process information, the processor and the memory controller communicating through interface circuits, an interface circuit including:
  a differential amplifier, the differential amplifier having a first input coupled to receive a voltage reference signal, a second input and an output;
  an inverter, the inverter input coupled to the differential amplifier output, wherein the inverter includes first and second transistors, the first and second transistors having source/drain regions; and
  a third transistor coupled between a source/drain region of the inverter and a power supply rail to cause a switching point of the inverter to track a common mode bias voltage of the differential amplifier.

26. The computer system of claim 25, wherein the differential amplifier is a self-biased amplifier.

27. The computer system of claim 25, wherein the third transistor is coupled between the inverter and a power supply rail such that a first source/drain region of the third transistor is coupled to a source/drain region of the inverter and a second source/drain region of the third transistor is coupled to the power supply rail, and wherein a gate region of the third transistor is coupled to receive the voltage reference signal.

* * * * *